US007174526B2

(12) United States Patent
Shrowty et al.

(10) Patent No.: US 7,174,526 B2
(45) Date of Patent: Feb. 6, 2007

(54) ACCURATE DENSITY CALCULATION WITH DENSITY VIEWS IN LAYOUT DATABASES

(75) Inventors: Vikram Shrowty, Fremont, CA (US); Santhanakrishnan Raman, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 132 days.

(21) Appl. No.: 10/903,836

(22) Filed: Jul. 30, 2004

(65) Prior Publication Data

US 2006/0026551 A1  Feb. 2, 2006

(51) Int. Cl.
*G06F 17/50* (2006.01)

(52) U.S. Cl. ............................................. 716/11; 716/4
(58) Field of Classification Search .................... 716/4, 716/2, 7, 10, 20; 438/618
See application file for complete search history.

(56) References Cited

U.S. PATENT DOCUMENTS

| | | | | |
|---|---|---|---|---|
| 6,093,631 A | * | 7/2000 | Jaso et al. .................. | 438/618 |
| 6,189,130 B1 | * | 2/2001 | Gofman et al. ................. | 716/7 |
| 6,484,300 B1 | * | 11/2002 | Kim et al. ....................... | 716/7 |
| 6,845,497 B2 | * | 1/2005 | Murai et al. .................... | 716/20 |
| 2002/0157076 A1 | * | 10/2002 | Asakawa ...................... | 716/10 |
| 2004/0083438 A1 | * | 4/2004 | Ohba et al. ..................... | 716/2 |

OTHER PUBLICATIONS

Pre-Algebra Key Concepts-Lesson 23, Glencoe/McGraw-Hill, p. 83, 2003. http://www.glencoe.com/sec/math/t-Resources/keyconcepts/pdfs/pa03kc_lession23.pdf.*

* cited by examiner

*Primary Examiner*—Leigh M. Garbowski
(74) *Attorney, Agent, or Firm*—Strategic Patent Group, P.C.

(57) ABSTRACT

Generating a density abstraction view for an integrated circuit design by dividing each block in the design that is larger than a predetermined size into a grid of rectangles; calculating a sum of metal area in each rectangle in the grid; creating an object in each rectangle having an area equal to the metal area sum of the rectangle; and storing all the created objects for the block as a view. The view may be stored in a layout database along with any other views for the integrated circuit design, and then used to determine density of a tile overlapping with the block by adding the area of the square objects in the density view that overlap with the tile to the tile.

14 Claims, 4 Drawing Sheets

ACCURATE DENSITY CALCULATION WITH DENSITY VIEWS IN LAYOUT DATABASES

FIELD OF THE INVENTION

The present invention relates to calculating density for integrated circuit design, and more particularly to a method for accurately calculating density for the design using an abstracted density view.

BACKGROUND OF THE INVENTION

Modern chip fabrication techniques impose restrictions on the density of conductors on a chip. These restrictions are usually implemented as design rules that define square "tiles" of a certain size and minimum and maximum allowable densities for those tiles. The density of a tile is the summation of the area of all metal objects in the tile divided by the area of the tile. A chip design must meet these before it can be taped out and sent to fabrication.

The size of the tile defined by the design rules have rapidly been getting smaller at each technology node, falling at an accelerated rate; much faster than the minimum feature size of objects in the tile. The minimum density rules are checked for and met by metal filler tools in the final phase of the chip design flow. These tools examine the design on a tile-by-tile basis and add metal to those tiles that are below the minimum allowed density. To be able to function correctly, these tools need to be able to accurately calculate the density of all tiles in the design. Certain other upstream tools such as power-routers, also need to be able to estimate the density of tiles in their region of operation. This is to ensure that they do not create any tiles that have a higher density than the maximum allowed density.

FIGS. 1 and 2 are diagrams illustrating conventional examples of where tool needs to calculate the density of a tile. In this example, a tool needs to ascertain the density of a tile 10 prior to inserting a wire 12 adjacent to a block 14 of cells (not shown) in an integrated circuit design. More specifically, the area of each object in the area of the block 14 that overlaps with the tile 10 has to be calculated and summed.

In a flat physical design, the computation of density for the tile 10 is a simple operation that is typically accomplished using a layout view of the block 14, as shown in FIG. 1. In a flat physical design, the block primarily comprises many standard, but intricate, cells having many small metal objects of different shapes. The layout view contains all the information necessary for describing all the metal objects in every cell. In this example, block 14 is shown comprising three large metal areas 16 formed by metal objects in contiguous groups of cells.

The density for the tile 10 is calculated by opening the layout view and by simply summing the areas of all metal objects that lie within the outline of the tile 10 and dividing that sum by the area of the tile 10 itself.

Most designs today, however, are hierarchical in nature and accurate calculation of density becomes a problem. In hierarchical designs, groups of standard cells may be grouped into larger cells, which may also be called a block. An example of a large hierarchical block of cells is a hard macro. In hierarchical designs, accurate calculation of density becomes a problem. While in flat designs, the cell size is a small percentage of the tile size, but in hierarchical designs, the tile may be a small fraction of a large block of cells.

In hierarchical designs, hierarchical blocks are represented by a simplified routing abstraction view, as shown in FIG. 2. The routing attraction view is simplified from the layout view in that it approximates many adjacent metal objects as large blocks 18. Objects found in these routing abstractions are either simplified bloated versions of the real objects or are blockages: place-holder objects occupying regions that are not to be routed over. As a result, metal area sum calculations that use routing abstractions tend to overestimate density and are inaccurate. Also, the large number and complicated geometries of objects in the routing abstraction slow down density computation. Using the original layout view of the block 15 as in FIG. 1, results in accurate density calculations, but at too high a cost of run-time to be a feasible solution due to all the area calculations required for the many individual metal objects.

Accordingly, what is needed is a way to efficiently calculate the density of hierarchical blocks in designs with acceptable accuracy. The present invention addresses such a need.

BRIEF SUMMARY OF THE INVENTION

The present invention provides a method for accurately calculating the density of hierarchical blocks by generating a density abstraction view for an integrated circuit design. This is accomplished by dividing each block in the design that is larger than a predetermined size into a grid of rectangles; calculating a sum of metal area in each rectangle in the grid; creating an object in each rectangle having an area equal to the metal area sum of the rectangle; and storing all the created objects for the block as a view. In further embodiments of the present invention, this "density view" may be stored in a layout database along with any other views for the integrated circuit design, and then used to determine density of a tile overlapping with the block by adding the density of the square objects in the density view that overlap the outline of the tile to the tile.

According to the method and system disclosed herein, the grid of the objects comprising the density view are simple shapes, such as squares, which makes the density computation is very efficient. A density computation based on the density view is much faster than using the layout view. In addition, the distribution of the objects in the density corresponds directly to the metal distribution in the block. Therefore, density calculations generated from the density view are more accurate than using the routing view.

DETAILED DESCRIPTION OF THE INVENTION

The present invention relates to calculating density for hierarchical blocks in a circuit design. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method for calculating density of hierarchical blocks in an integrated circuit design by abstracting the density of the hierarchical block into a new view, referred to herein as a density view, that captures the density distribution of the block. Once the density view is created for a hierarchical block, the view is saved and made available along with any other views of the block, such as the layout and routing views.

In a preferred embodiment of the present invention, the density calculation is performed by a software module, which may be a standalone application, or may be called by, or incorporated into, any tool that needs to perform density rule checking.

Figure 1:
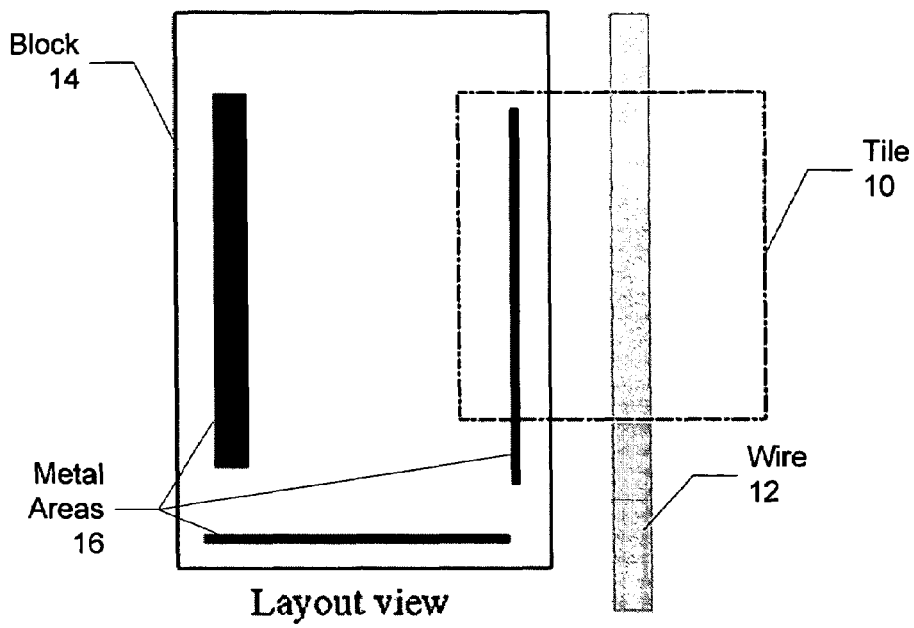
FIGS. 1 and 2 are diagrams illustrating conventional examples of where tool needs to calculate the density of a tile.
Figure 2:
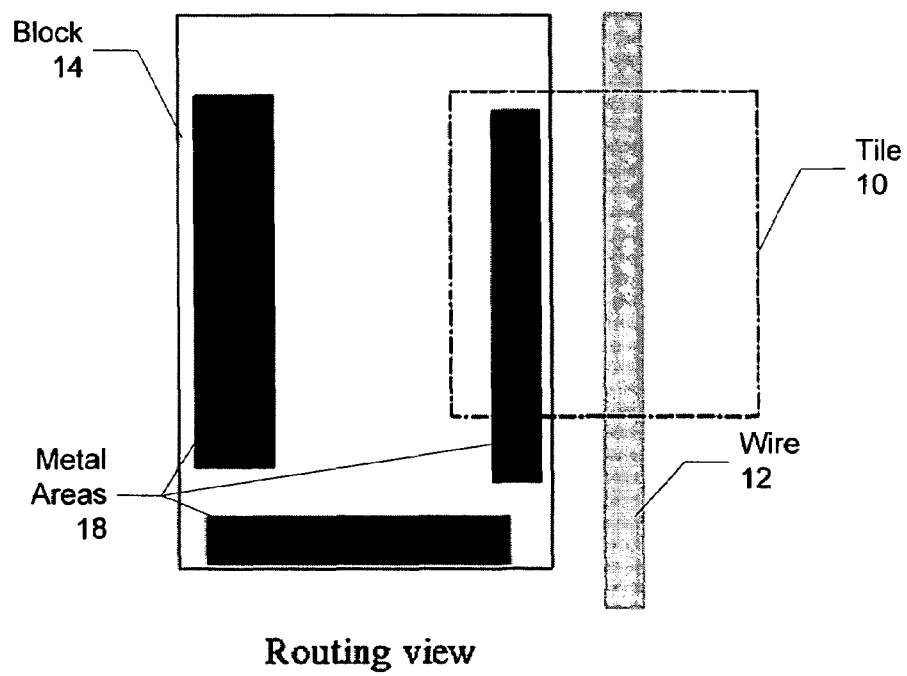
Figure 3:
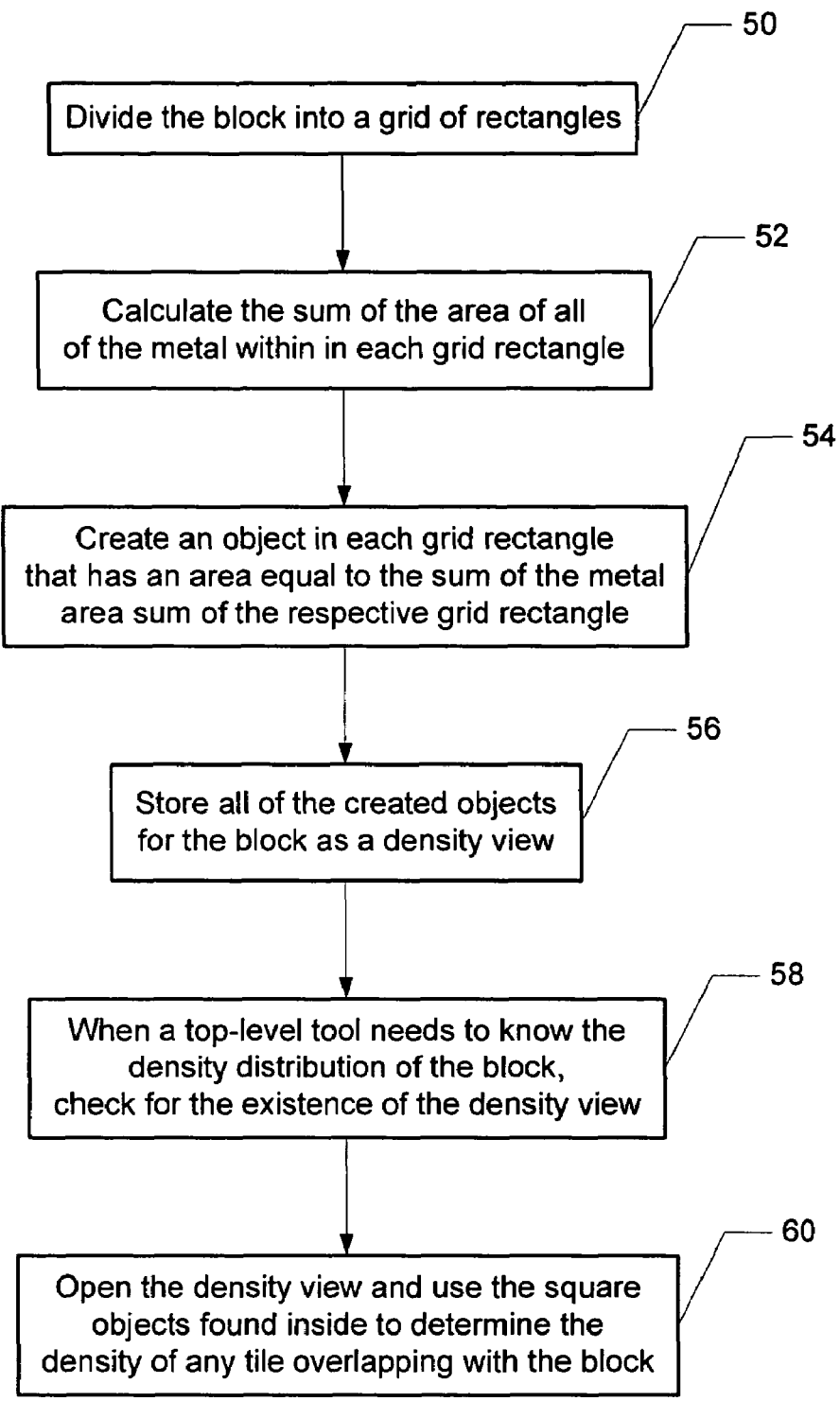
FIG. 3 is a flow diagram illustrating the process the software module performs for generating the density view for a block in an integrated circuit design.

FIG. 3 is a flow diagram illustrating the process the software module performs for generating the density view for a block in an integrated circuit design. In a preferred embodiment, the density view is only generated for blocks of cells in the design that are larger than a predetermined size, e.g., some fraction (⅛th, ¹/₁₀th) or multiple of the tile size. The software module begins the process in step 50 by dividing the block into a grid of rectangles.

Figure 4:
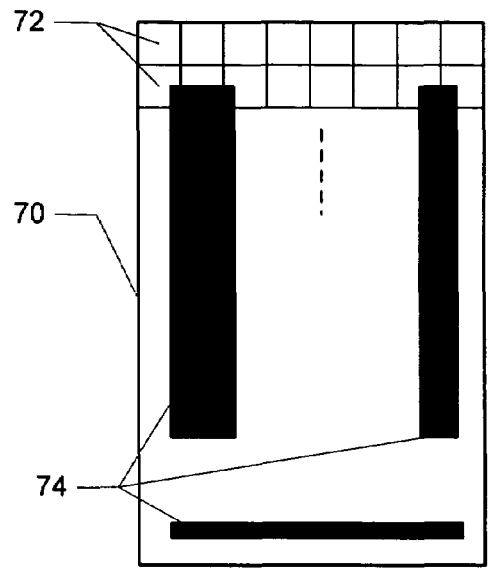
FIG. 4 is a block diagram illustrating an example block divided into a grid of rectangles.

FIG. 4 is a block diagram illustrating an example block 70 divided into a grid of rectangles 72. The actual grid-size may be arrived at through trial and error, but should be constant for a given process technology. The smaller the grid size, however, the more accurate the density calculation.

Referring again to FIG. 3, in step 52, the software tool calculates the sum of the area of all of the metal 74 within in each grid rectangle 72. In step 54, the software tool then creates an object in each grid rectangle 72 that has an area equal to the sum of the metal area sum of the respective grid rectangle 72. The sum of the metal is stored as an object and not as value so that tools can seamlessly move from using layout/abstraction views to the density view. Also, the layout database in which the view is to be stored may not support storage and retrieval of such values. But polygons can always be stored in a layout database, and very efficiently retrieved.

Figure 5:
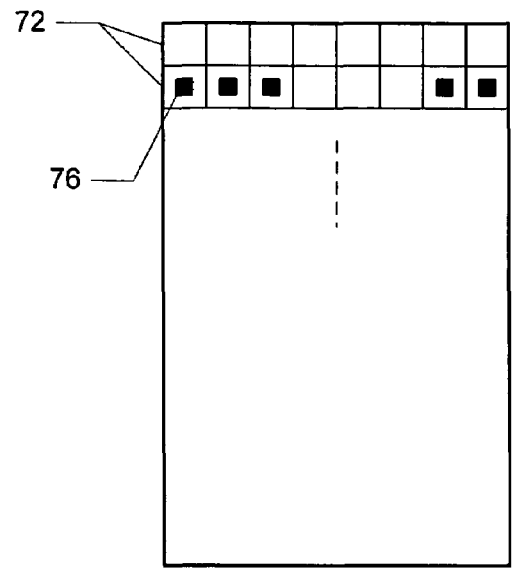
FIG. 5 is a diagram showing objects created for representative grid rectangles in which metal is present.

FIG. 5 is a diagram showing objects 76 created for representative grid rectangles 72 in which metal 74 is present. In a preferred embodiment, the objects 76 are located at the coordinates of the center-point of each grid rectangle 72 in the block. Also in the preferred embodiment, the objects 76 are made square in shape where each side of a square object 76 is equal to the square-root of the sum of the metal area within the rectangle. The objects may be made into other shapes other than a square, such as a rectangle or circle, for example.

Referring again to FIG. 3, after creating objects 76, the software tool in step 56 stores all of the created objects 76 for the block 70 as a separate view, called the density view, but then those shapes might require more CPU cycles for area computation.

Figure 6:
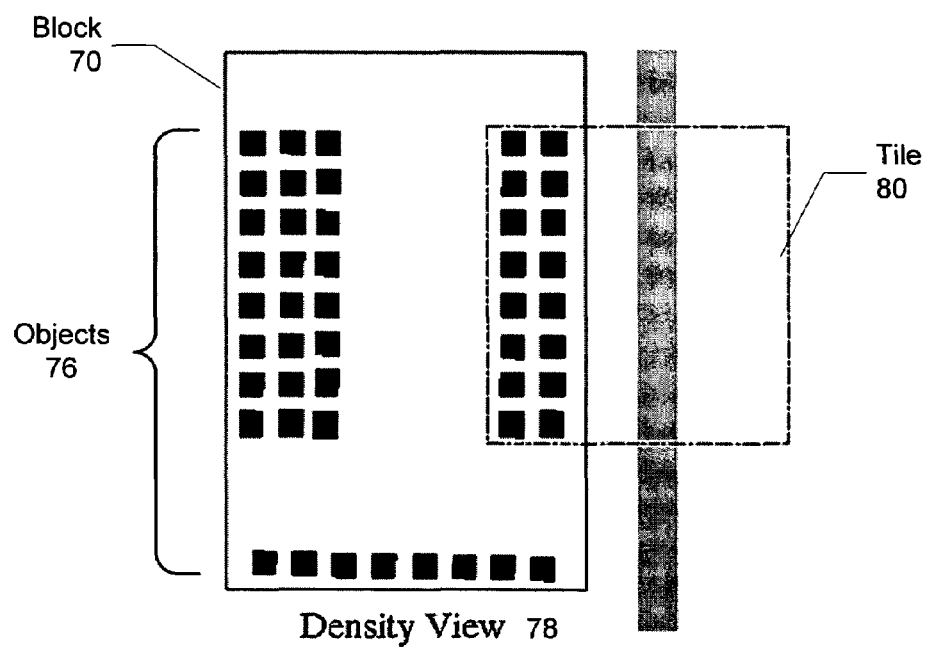
FIG. 6 is a diagram graphically illustrating the density view for the block.

FIG. 6 is a diagram graphically illustrating the density view 78 for the block 50. This density view 78 represents the density abstraction for the block 50 and preferably has the same dimensions as the layout view. Creating a new view should not pose a problem since most layout databases are capable of housing multiple views of a block. The density view 78 may be saved in the layout database along with any other views.

Referring again to FIG. 3, when a tool being run on the top-level of the design needs to know about the density distribution of the block 70, it checks for the existence of the density view 78 of the block 50 in step 58. If found, in step 60 the tools opens this density view 78 and uses the square objects 76 found inside to determine the density of any tile 80 overlapping with the block 50. The density view 78 may also be opened and used to calculate metal density of the block 70 by summing the objects in the density view 78.

Because the number of objects 76 in the density view of is limited by the grid and block size, and because the objects 76 are simple squares, density computation is very efficient. Consequently, density computation based on the density view 78 is much faster than using the layout view. The size of the grid used to generate the density controls the accuracy, as well as computational cost of the density calculation. This size can be a heuristic based on the tile size defined by the density rule and needs to be finalized once for a process technology. In addition, the distribution of the square objects 76 in the density 78 corresponds directly to the metal distribution in the block. Therefore, density calculations generated from the density view 78 are more accurate than using the routing view.

Figure 7:
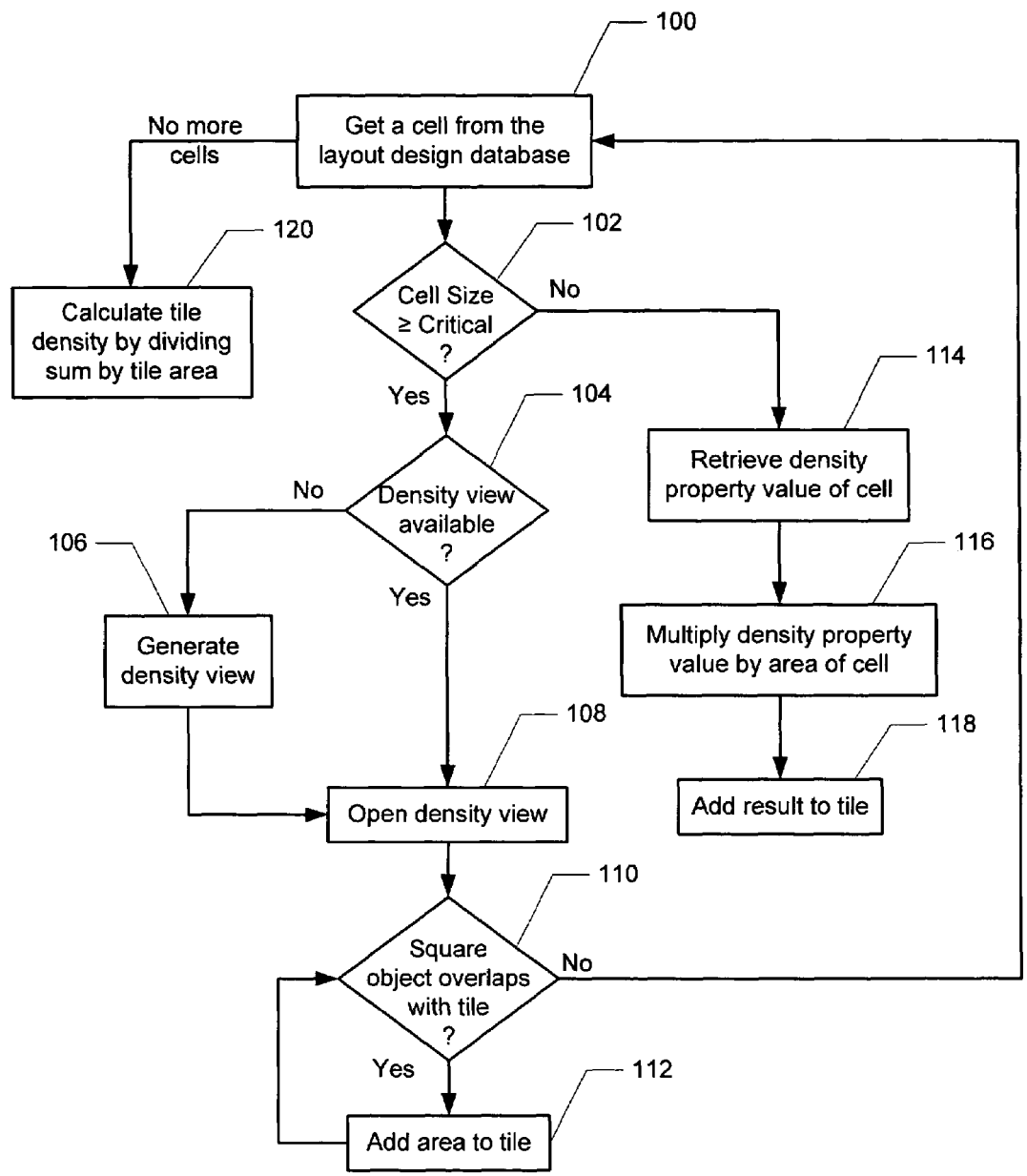
FIG. 7 is a flow diagram illustrating the process the software tool would use to both create and use the density view when determining the density of a tile adjacent to a hierarchal block in the design.

FIG. 7 is a flow diagram illustrating the process the software tool would use to both create and use the density view when determining the density of a tile adjacent to a hierarchal block in the design. The process begins in step 100 in which the software tool gets a cell from the layout design database, and determines in step 102 whether the cell size is greater than a predetermined critical size. If yes, then the cell is considered a block and the software tool in step 104 checks for the existence of a density view for that block. If the density view for the block is not found, then in step 106 the density view 78 is generated for the block using the layout view, as described above. In step 108, the software tool opens the density view 78. In step 110 the software tool determines whether a square object 76 in the density view 78 overlaps with a tile 80. If so, in step 112 the metal area for the square object 76 is added to the tile 80.

This is accomplished by determining if a square object 76 in the block 50 overlaps with the adjacent tile 80. If so, then the area of each of the square object 76 is added to the metal area of the tile 80, and the process continues in step 110 for each square object 76 in the density view 78. If the square object 76 does not overlap with the tile 80, then the process continues with getting the next cell from the layout database in step 100.

If the cell is not greater than or equal to the critical size in step 102, then the software tool in step 114 retrieves a pre-stored density property value for the cell. The software tool in step 116 multiplies the density property value by the area of the cell, and adds the result to the density of the tile 80 in step 118. The process continues at step 100 for each cell from the layout design database. The process ends in step 120 by calculating the density for tile by dividing the sum by the area for the tile.

A method and system for accurately calculating density for the design using an abstracted density view has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A method for generating a density abstraction view for an integrated circuit design, comprising:
   dividing each block in the design that is larger than a predetermined size into a grid of rectangles;
   calculating a sum of metal area in each rectangle in the grid;
   creating an object in each rectangle having an area equal to the metal area sum of the rectangle; and
   storing all the created objects for the block as a view.

2. The method of claim 1 further comprising storing the view in a layout database along with any other views for the integrated circuit design.

3. The method of claim 2 further comprising: using the view to determine density of a tile overlapping with the block by adding the area of the objects in the density view that overlap with the tile to the tile.

4. The method of claim 2 further comprising: using the view to calculate metal density of the block by summing the objects in the view.

5. The method of claim 1 further comprising: locating the objects at respective center-points of the grid rectangles.

6. The method of claim 5 further comprising: creating square objects.

7. The method of claim 6 wherein each side of each of the square objects is equal to a square-root of the sum of the metal area for that square.

8. A computer-readable medium containing program instructions for generating a density abstraction view for an integrated circuit design, the program instructions for:
   dividing each block in the design that is larger than a predetermined size into a grid of rectangles;
   calculating a sum of metal area in each rectangle in the grid;
   creating an object in each rectangle having an area equal to the metal area sum of the rectangle; and
   storing all the created objects for the block as a view.

9. The computer-readable medium of claim 8 further including instructions for storing the view in a layout database along with any other views for the integrated circuit design.

10. The computer-readable medium of claim 9 further including instructions for: using the view to determine density of a tile overlapping with the block by adding the area of the objects in the density view that overlap with the tile to the tile.

11. The computer-readable medium of claim 9 further including instructions for: using the view to calculate metal density of the block by summing the objects in the view.

12. The computer-readable medium of claim 9 further including instructions for: locating the objects at respective center-points of the grid rectangles.

13. The computer-readable medium of claim 12 further including instructions for: creating square objects.

14. The computer-readable medium of claim 13 wherein each side of each of the square objects is equal to a square-root of the sum of the metal area for that square.

* * * * *